(12) United States Patent
Tayanaka

(10) Patent No.: US 6,759,310 B2
(45) Date of Patent: Jul. 6, 2004

(54) METHOD FOR MAKING A SEMICONDUCTOR SUBSTRATE COMPRISING A VARIANT POROUS LAYER

(75) Inventor: Hiroshi Tayanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/067,486

(22) Filed: Feb. 4, 2002

(65) Prior Publication Data

US 2002/0153595 A1 Oct. 24, 2002

Related U.S. Application Data

(63) Continuation of application No. 09/217,907, filed on Dec. 22, 1998, now abandoned.

(30) Foreign Application Priority Data

Dec. 26, 1997 (JP) .............................. P9-360429

(51) Int. Cl.⁷ ......................... H01L 21/30; H01L 21/46
(52) U.S. Cl. ....................... 438/458; 438/406; 438/409; 438/459; 438/759
(58) Field of Search ..................... 438/455, 406, 438/409, 458, 459, 507, 478, 466, 759, 485

(56) References Cited

U.S. PATENT DOCUMENTS 5,250,460 A * 10/1993 Yamagata et al. .......... 438/458
5,371,037 A * 12/1994 Yonehara ..................... 438/459
5,374,564 A * 12/1994 Bruel .......................... 438/455
5,476,006 A * 12/1995 Fujii et al. .................... 73/105
5,854,123 A * 12/1998 Sato et al. ................... 438/507
5,856,229 A *  1/1999 Sakaguchi et al. ......... 438/406
6,143,628 A * 11/2000 Sato et al. ................... 438/455

FOREIGN PATENT DOCUMENTS

JP           356054078 A  *  5/1981

* cited by examiner

*Primary Examiner*—Amir Zarabian
*Assistant Examiner*—Khanh Duong
(74) *Attorney, Agent, or Firm*—Sonnenschein, Nath & Rosenthal LLP

(57) ABSTRACT

A semiconductor substrate includes a porous semiconductor having: a porous layer, with an impurity concentration on varying in the depth direction, or having a porous semiconductor containing an impurity with a content of $1 \times 10^{18} cm^{-3}$ or more, or provided by pore formation in an epitaxial growth layer. A method of making a semiconductor substrate; includes forming a variant impurity layer with an impurity concentration varying in the depth direction on one surface of a supporting substrate, and converting the variant impurity layer into a porous layer having a variant porosity in the depth direction. A method of making a thin-film semiconductive member; includes forming a semiconductive thin film on the supporting substrate and separating it by cleavage in the porous phase, in addition to the method for making the semiconductor substrate.

12 Claims, 11 Drawing Sheets

METHOD FOR MAKING A SEMICONDUCTOR SUBSTRATE COMPRISING A VARIANT POROUS LAYER

RELATED APPLICATION DATA

This is a Continuation Application of U.S. application No. 09/217,907 filed Dec. 22, 1998 now abandoned, which claims priority to Japanese Application No. P09-360429, filed Dec. 26, 1997.

BACKGROUND OF THE INVENTION

1. Field of the Invention

The present invention relates to a semiconductor substrate having a porous layer, a thin-film semiconductive member formed using the same, and a method for making them.

2. Description of the Related Art

The following studies have been performed in technical fields such as solar batteries. A silicon thin-film is formed on a porous layer provided on a silicon substrate which is made by cutting a single-crystal ingot, and then the thin film is separated from the substrate by cleavage of the porous layer.

It is preferable that the porous layer include at least two sublayers having different porosities in order to facilitate separation of the thin film from the substrate. Such a porous layer is formed by, for example, anodic oxidation of the surface layer of the substrate while varying a current density on the surface layer. The anodic oxidation means electrolysis of the substrate as an anode in an electrolytic solution containing hydrogen fluoride (HF). For example, anodic oxidation is performed by conducting a current flow with a current density of 1 mAcm$^{-2}$ for 8 minutes, a current density of 7 mAcm$^{-2}$ for 8 minutes, and then a current density of 200 mAcm$^{-2}$ for 4 seconds in an electrolytic solution of a 1:1 mixture of 50% hydrogen fluoride and ethyl alcohol ($C_2H_5OH$). The formed porous layer has a high-porosity sublayer interposed between two low-porosity sublayers.

The formation of the high-porosity sublayer, however, requires a large current density. As a result, distortion will occur in the porous layer, and hinders an improvement in crystallinity of the thin film formed thereon. A large current density also causes a nonuniform distribution of current density in the surface layer of the substrate. Thus, a high-porosity sublayer is unevenly formed in the porous layer. As a result, the thin film cannot be easily separated at some portions. Furthermore, such a current flow of a large current density requires a large electric power source.

SUMMARY OF THE INVENTION

It is an object of the present invention to provide a semiconductor substrate having a porous layer with reduced distortion and allowing ready cleavage in the porous layer, by decreasing a current density during anodic oxidation.

It is another object of the present invention to provide a thin-film semiconductive member having high crystallinity.

It is a further object of the present invention to provide methods for making a semiconductor substrate and a thin-film semiconductive member, capable of reducing the current density in anodic oxidation for forming a porous layer.

A first aspect of the present invention is a semiconductor substrate comprising a porous semiconductor having a porous layer with an impurity concentration distribution varying in the depth direction.

A second aspect of the present invention is a semiconductor substrate comprising a porous layer comprising a porous semiconductor containing an impurity with a content of $1\times10^{18}$ cm$^{-3}$ or more.

A third aspect of the present invention is a semiconductor substrate comprising a porous layer provided by pore formation in an epitaxial growth layer.

A fourth aspect of the present invention is a thin-film semiconductive member formed on one surface of a supporting substrate with a porous layer provided therebetween, and separated from the supporting substrate by cleavage in the porous layer, the porous layer comprising a porous semiconductor having an impurity concentration varying in the depth direction.

A fifth aspect of the present invention is a thin-film semiconductive member formed on one surface of a supporting substrate with a porous layer provided therebetween, and separated from the supporting substrate by cleavage in the porous layer, the porous layer comprising a porous semiconductor having an impurity concentration of $1\times10^{18}$ cm$^{-3}$ or more.

A sixth aspect of the present invention is a thin-film semiconductive member formed on one surface of a supporting substrate with a porous layer provided therebetween, and separated from the supporting substrate by cleavage in said porous layer, the porous layer being provided by pore formation in an epitaxial growth layer.

A seventh aspect of the present invention is a method for making a semiconductor substrate comprising a variant layer forming step for forming a variant impurity layer with an impurity concentration varying in the depth direction on one surface of a supporting substrate, and a porous layer forming step for forming a porous layer by providing pores in the variant impurity layer by anodic oxidation so that the porosity in the porous layer varies in the depth direction.

An eighth aspect of the present invention is a method for making a semiconductor substrate comprising a high-impurity layer forming step for forming a high-impurity layer comprising a semiconductor having an impurity concentration of $1\times10^{18}$ cm$^{-3}$ or more on one surface of a supporting substrate, and a porous layer forming step for forming pores in the high-impurity layer by anodic oxidation to form a porous layer having different porosities in the depth direction.

A ninth aspect of the present invention is a method for making a thin-film semiconductive member comprising a variant layer forming step for forming a variant impurity layer with an impurity concentration varying in the depth direction on one surface of a supporting substrate a porous layer forming step for forming a porous layer by providing pores in the variant impurity layer by anodic oxidation so that the porosity in the porous layer varies in the depth direction, a step for forming a semiconductive thin film on the surface, away from the supporting substrate, of the porous layer, and a separation step for separating the semiconductive thin film from the supporting substrate by cleavage in the porous phase.

A tenth aspect of the present invention is a method for making a thin-film semiconductive member comprising a high-impurity layer forming step for forming a high-impurity layer comprising a semiconductor having an impurity concentration of $1\times10^{18}$ cm$^{-3}$ or more on one surface of a supporting substrate, a porous layer forming step for forming pores in the high-impurity layer by anodic oxidation to form a porous layer having different porosities in the depth direction, a step for forming a semiconductive thin film on the surface, away from the supporting substrate, of the porous layer; and a separation step for separating the semiconductive thin film from the supporting substrate by cleavage in the porous phase.

In the semiconductor substrate in the first aspect of the present invention, the impurity concentration distribution varies in the depth direction in the porous layer. For example, the porous layer is formed by anodic oxidation with a small current density and has reduced distortion.

In the semiconductor substrate in the second aspect of the present invention, the impurity concentration in the porous layer is $1 \times 10^{18}$ cm$^{-3}$ or more. Thus, the porous layer is formed by anodic oxidation with a small current density and has reduced distortion.

In the semiconductor substrate in the third aspect of the present invention, the porous layer is provided by pore formation in an epitaxial growth layer. Thus, the porosity in the direction parallel to the surface becomes readily uniform, or the porous layer may be composed of a semiconductor having a high impurity concentration.

The thin-film semiconductive member in the fourth aspect of the present invention has a porous layer having a variant impurity concentration in the depth direction. The porosity in the porous layer varies with the impurity concentration. The porous layer may be formed by anodic oxidation with a reduced current density and has reduced distortion. The thin film semiconductive member has high crystallinity.

The thin-film semiconductive member in the fifth aspect of the present invention has a porous layer having an impurity concentration of $1 \times 10^{18}$ cm$^{-3}$ or more. The porous layer may be formed by anodic oxidation with a reduced current density and has reduced distortion. The thin film semiconductive member has high crystallinity.

The thin-film semiconductive member in the sixth aspect of the present invention has a porous layer provided by pore formation in an epitaxial growth layer. Thus, the porosity in the direction parallel to the surface becomes readily uniform, or the porous layer may be composed of a semiconductor having a high impurity concentration.

In the method for making a semiconductor substrate in the seventh aspect of the present invention, a variant impurity layer with an impurity concentration varying in the depth direction is first formed on one surface of a supporting substrate. Next, the variant impurity layer is converted into a porous layer having a variant porosity in the depth direction.

In the method for making a semiconductor substrate in the eighth aspect of the present invention, a high-impurity layer comprising a semiconductor having an impurity concentration of $1 \times 10^{18}$ cm$^{-3}$ or more is first formed on one surface of a supporting substrate. Next, the variant impurity layer is converted into a porous layer having a variant porosity in the depth direction.

In the method for making a thin-film semiconductive member in the ninth aspect of the present invention, a variant impurity layer with an impurity concentration varying in the depth direction is formed on one surface of a supporting substrate. Next, the variant impurity layer is converted into a porous layer having a variant porosity in the depth direction. A semiconductive thin film is formed and is separated from the supporting substrate by cleavage in the porous phase.

In the method for making a thin-film semiconductive member in the tenth aspect of the present invention, a high-impurity layer comprising a semiconductor having an impurity concentration of $1 \times 10^{18}$ cm$^{-3}$ or more is formed on one surface of a supporting substrate. Next, the variant impurity layer is converted into a porous layer having a variant porosity in the depth direction. A semiconductive thin film is formed and is separated from the supporting substrate by cleavage in the porous phase.

BRIEF DESCRIPTION OF THE DRAWINGS

FIG. 22 is a schematic cross-sectional view of another porous layer in Example 4 in accordance with the present invention.

DESCRIPTION OF THE PREFERRED EMBODIMENTS

Embodiments of the present invention will now be described in detail with reference to the attached drawings.

In these embodiments, both a semiconductor substrate and a thin-film semiconductive member will be described.

Figure 1:
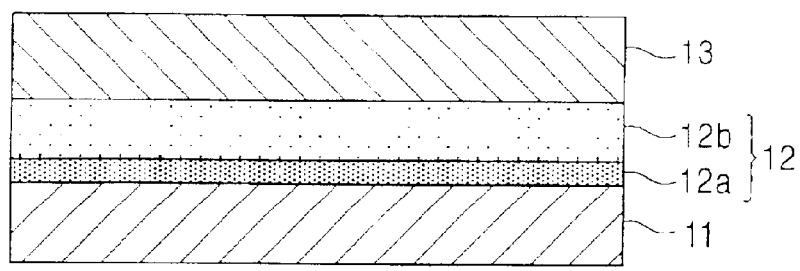
FIG. 1 is a cross-sectional view of a semiconductor substrate in accordance with an embodiment of the present invention.

FIG. 1 is a cross-sectional view of a semiconductor substrate in accordance with a first embodiment of the present invention. The semiconductor substrate includes a supporting substrate 11, a porous layer 12 formed thereon, and a semiconductive thin film 13 formed thereon. The supporting substrate 11, the porous layer 12, and the semiconductive thin film 13 are each composed of a semiconductor containing at least one of silicon (Si) and germanium (Ge), a semiconductor containing gallium (Ga) and arsenic (As), and a semiconductor containing gallium (Ga) and phosphorus (P), or a semiconductor containing gallium and nitrogen (N). These layers may be composed of the same semiconductor or different semiconductors. These semiconductors may be of a p-type containing a p-type impurity, of an n-type containing an n-type impurity, or of a type containing no impurity. Furthermore, each semiconductor may be a single crystal or polycrystalline semiconductor.

Figure 5:
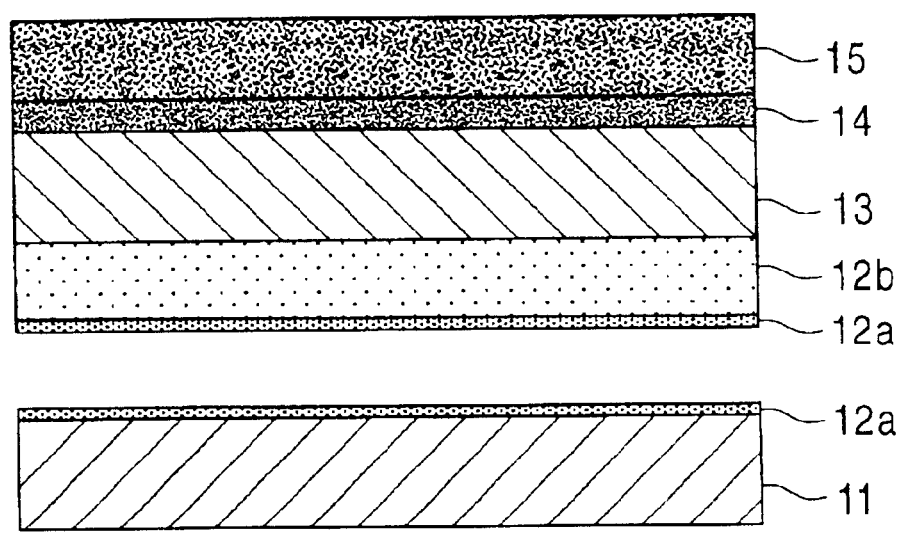
FIG. 5 is a cross-sectional view of a thin-film semiconductive member in accordance with an embodiment of the present invention.

When the porous layer 12 is formed by anodic oxidation, the supporting substrate 11 and the porous layer 12 are preferably composed of p-type semiconductors. The supporting substrate 11 may be composed of a material other than a semiconductor, such as sapphire, that permits the formation of the porous layer 12 thereon. A particularly effective semiconductor substrate has a single-crystal semiconductive thin film 13. A polycrystalline semiconductive thin film 13 can be easily and directly formed on any substrate, for example, an adhesive substrate 15 as shown in FIG. 5. In contrast, a single-crystal semiconductive thin film cannot be formed by such a manner. This semiconductor substrate, however, permits ready production of a single-crystal semiconductive thin film 13 with high crystallinity.

Figure 2:
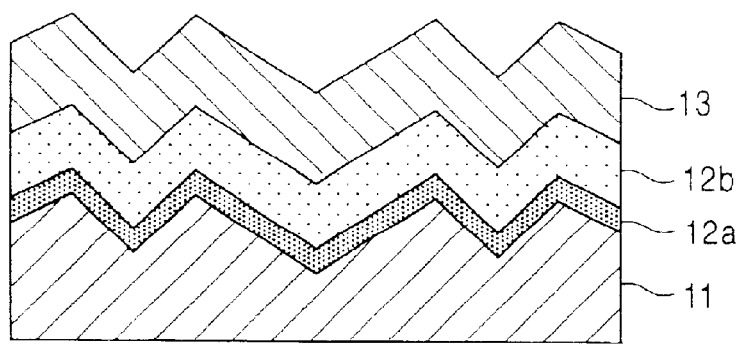
FIG. 2 is a cross-sectional view of a modification of the semiconductor substrate shown in FIG. 1.

The surfaces of the supporting substrate 11, the porous layer 12 and the semiconductive thin film 13 may each be flat, as shown in FIG. 1, or may be uneven, as shown in FIG. 2. A solar battery using an uneven semiconductive thin film 13 as a thin film semiconductive member has a high generating efficiency of electrical power.

The porous layer 12 comprises a plurality of sublayers having different porosities (a high-porosity sublayer 12a and a low-porosity sublayer 12b in this embodiment). Thus, the porosity of the porous layer 12 varies in the depth direction (perpendicular to the surface of the supporting substrate 11). In the porous layer 12, the high-porosity sublayer 12a is placed on the supporting substrate 11 (at the inner side), and the low-porosity sublayer 12b is placed thereon (at the surface side).

The high-porosity sublayer 12a is provided for separating the semiconductive thin film 13 from the supporting substrate 11. The porosity of the high-porosity sublayer 12a is preferably in a range of approximately 40 to 70% in order to facilitate the separation. The low-porosity sublayer 12b has a lower porosity than that of the high-porosity sublayer 12a in order to ensure the formation of a semiconductive thin film 13 having high crystallinity thereon.

These porous sublayers 12a and 12b have different impurity concentrations. The high-porosity sublayer 12a has a lower impurity concentration, whereas the low-porosity sublayer 12b has a higher impurity concentration. Accordingly, the impurity concentration in the porous layer 12 varies in the depth direction. Such a difference in the impurity concentration between the high-porosity sublayer 12a and the low-porosity sublayer 12b is provided for controlling the porosity in the porous layer 12 formed by anodic oxidation, wherein the porosity depends on the impurity concentration. For example, when the supporting substrate 11 and the porous layer 12 are each composed of a p-type silicon containing boron (B) as a p-type impurity, the impurity concentration in the high-porosity sublayer 12a is preferably less than $1 \times 10^{19}$ cm$^{-3}$, whereas the impurity concentration in the low-porosity sublayer 12b is preferably $1 \times 10^{19}$ cm$^{-3}$ or more. The high-porosity sublayer 12a and the low-porosity sublayer 12b may each have a uniform or nonuniform distribution of the impurity concentration in the depth direction.

Alternatively, the high-porosity sublayer 12a and the low-porosity sublayer 12b may have the same impurity concentration of $1 \times 10^{18}$ cm$^{-3}$ or more and preferably $1 \times 10^{19}$ cm$^{-3}$ or more. Since the resistance of the layer decreases as the impurity concentration increases, the high-porosity sublayer 12a and the low-porosity sublayer 12b can be formed by anodic oxidation of the porous layer 12 with a small change of current density.

Figure 3:
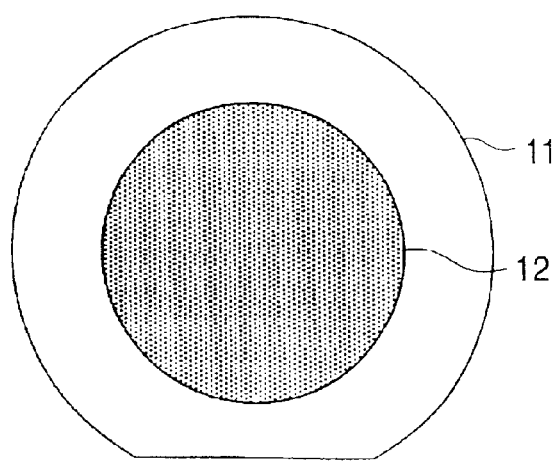
FIG. 3 is a plan view of a modification of the semiconductor substrate shown in FIG. 1.

The porous layer 12 is preferably provided by forming pores in a layer deposited by, for example, epitaxial growth. This method facilitates a higher impurity concentration, and a uniform distribution of the impurity concentration and thus a uniform porosity in the transverse direction parallel to the surface of the supporting substrate 11. The porous layer 12 may be formed on the entire surface of the supporting substrate 11, or on a part of the surface of the supporting substrate 11, as shown by a grid pattern in a plan view of FIG. 3.

Figure 4:
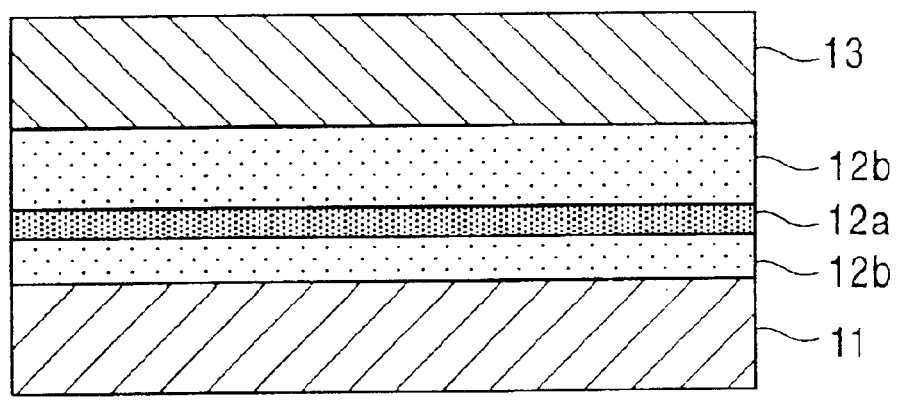
FIG. 4 is a cross-sectional view of another modification of the semiconductor substrate shown in FIG. 1.

In FIG. 1, the high-porosity sublayer 12a is provided between the low-porosity sublayer 12b and the supporting substrate 11 and the low-porosity sublayer 12b is provided between the high-porosity sublayer 12a and the semiconductive thin film 13. The high-porosity sublayer 12a may be provided on the surface, at the side of the supporting substrate 11, of at least one low-porosity sublayer 12b. For example, the high-porosity sublayer 12a may be interposed between two low-porosity sublayers 12b as shown in FIG. 4. In this case, these low-porosity sublayers 12b may have different impurity concentrations and porosities.

With reference to FIG. 5, an adhesive substrate 15 is bonded to the surface of the semiconductive thin film 13 with an adhesive layer 14 therebetween, and the semiconductive thin film 13 is separated from the supporting substrate 11 by cleavage in the high-porosity sublayer 12a. The separated semiconductive thin film 13 corresponds to the thin-film semiconductive member in accordance with this embodiment and is used for solar batteries etc., together with the adhesive substrate 15. The adhesive layer 14 is composed of a light-curable resinous adhesive having an adhesive strength higher than the strength of the high-porosity sublayer 12a. The adhesive substrate 15 is composed of, for example, a transparent resin such as polyethylene terephthalate (PET) or glass. The supporting substrate 11 can be reused after removing the porous layer 12 on the surface.

The semiconductor substrate and the thin-film semiconductive member having the above-mentioned configurations are produced as follows.

Figure 6A:
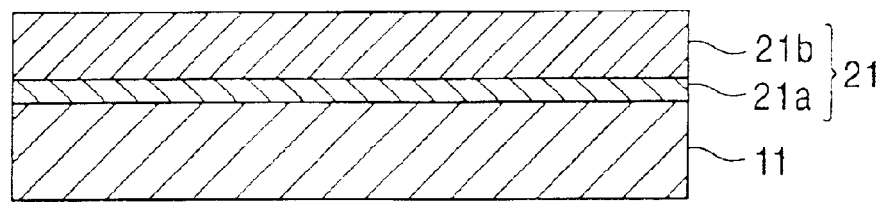
FIGS. 6A to 6C are cross-sectional views for showing steps of a production process of the semiconductor substrate shown in FIG. 1.
Figure 6B:
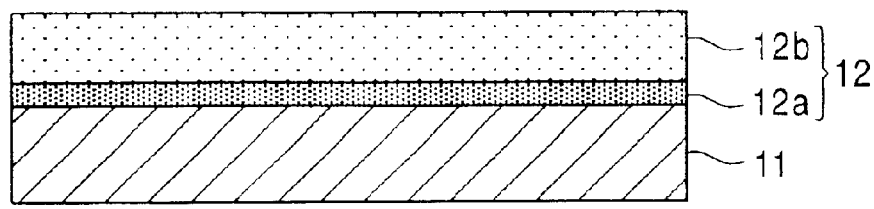
Figure 6C:
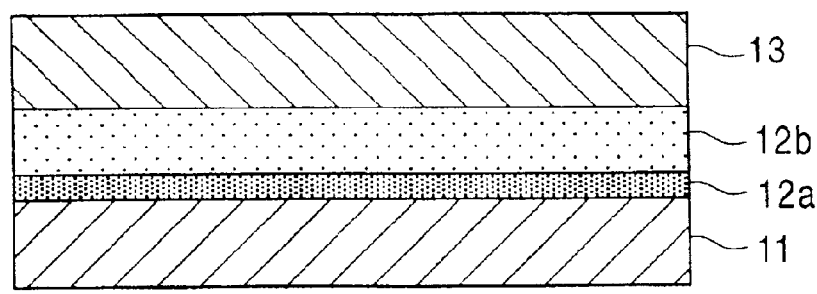

FIGS. 6A to 6C show the production steps of the semiconductor substrate and the thin-film semiconductive member. With reference to FIG. 6A, a supporting substrate 11 is prepared. The supporting substrate 11 may be composed of a semiconductor or a material, for example, sapphire, which is capable of forming a semiconductor layer on the surface. The supporting substrate 11 may have an uneven surface as shown in FIG. 2.

A semiconductor layer 21 having an impurity concentration which varies in the depth direction (hereinafter the semiconductor layer is referred to as a variant impurity layer) is formed on one surface of the supporting substrate 11 (a variant layer forming step). That is, a plurality of sublayers having different impurity concentrations (a low-impurity sublayer 21a and a high-impurity sublayer 21b in this embodiment) is formed as the variant impurity layer 21. The variant impurity layer will be converted into a porous layer 12 later, and the impurity concentration in the variant impurity layer is determined depending on the porosity of the porous layer 12. The impurity concentration in the low-impurity sublayer 21a is determined in view of the porosity of the high-porosity sublayer 12a, whereas the impurity concentration in the high-impurity sublayer 21b is determined in view of the porosity of the low-porosity sublayer 12b. For example, it is preferable that the impurity concentration in the low-impurity sublayer 21a be less than $1\times10^{19}$ cm$^{-3}$ and the impurity concentration in the high-impurity sublayer 21b be $1\times10^{19}$ cm$^{-3}$ or more, when the supporting substrate 11 and the variant impurity layer 21 are each formed of p-type silicon containing boron as a p-type impurity.

Figure 7A:
FIGS. 7A and 7B are cross-sectional views for showing steps of forming a variant impurity layer in the production steps shown in FIG. 6.
Figure 7B:
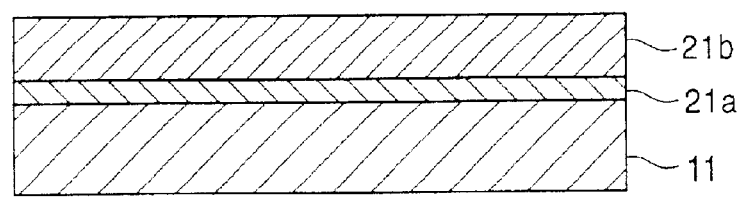
Figure 8A:
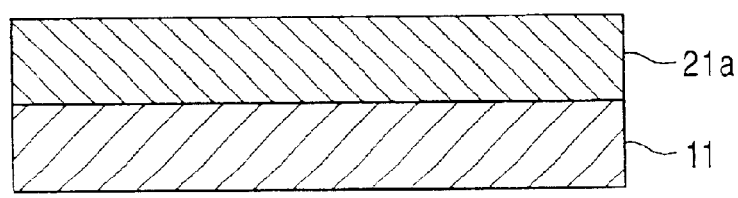
FIGS. 8A and 8B are cross-sectional views for showing other steps of forming a variant impurity layer in the production steps shown in FIG. 6.
Figure 8B:
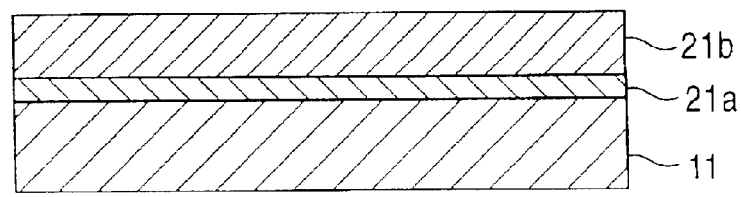
Figure 9:
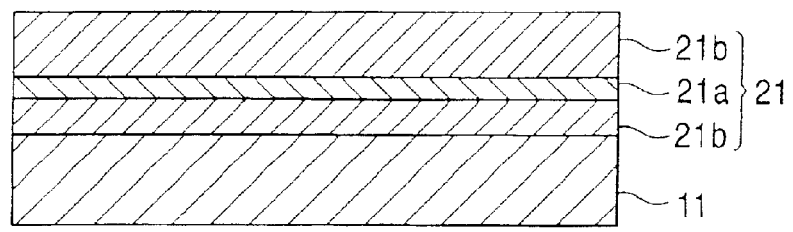
FIG. 9 is a cross-sectional view for showing a step of forming another variant impurity layer in the production steps shown in FIG. 6.

The variant impurity layer may be formed as shown in FIGS. 7A and 7B. A low-impurity sublayer 21a is epitaxially deposited on one surface of a supporting substrate 11 by a chemical vapor deposition (CVD) process, and then a high-impurity sublayer 21b is epitaxially deposited by a CVD process. In an alternative embodiment as shown in FIGS. 8A and 8B, a low-impurity sublayer 21a is epitaxially deposited on one surface of a supporting substrate 11 by a CVD process and then an impurity is diffused into the surface to form a high-impurity sublayer 21b as a diffusion layer. In another embodiment, a low-impurity sublayer 21a and a high-impurity sublayer 21b may be formed as diffusion layers by diffusing an impurity into one surface of a supporting substrate 11, although not shown in the drawing.

It is preferable that the low-impurity sublayer 21a be formed by epitaxial growth rather than diffusion, because the high-porosity sublayer 12a can have a uniform impurity concentration and thus a uniform porosity in the transverse direction.

Figure 10:
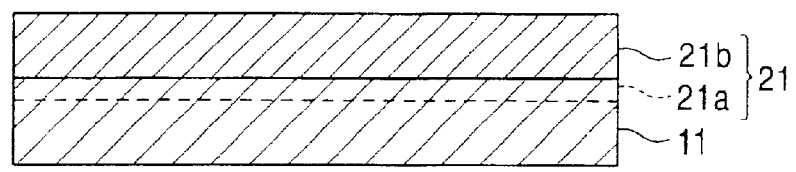
FIG. 10 is a cross-sectional view for showing a step of forming another variant impurity layer in the production steps shown in FIG. 6.

The variant impurity layer may be formed of a plurality of sublayers having different impurity concentrations such that a high-impurity sublayer 21b is placed on the surface, away from the supporting substrate 11, of the low-impurity sublayer 21a, as shown in FIG. 6A. In another embodiment, as shown in FIG. 10, a high-impurity sublayer 21b, a low-impurity sublayer 21a, and a high-impurity sublayer 21b may be formed in that order on a supporting substrate 11. As shown in FIG. 10, when the supporting substrate 11 is formed of a p-type semiconductor, a high-impurity sublayer 21b may be formed on the supporting substrate 11 in which the upper portion of the supporting substrate 11 is regarded as a low-impurity sublayer 21a, and the low-impurity sublayer 21a and the high-impurity sublayer 21b forms a variant impurity layer 21.

Figure 11:
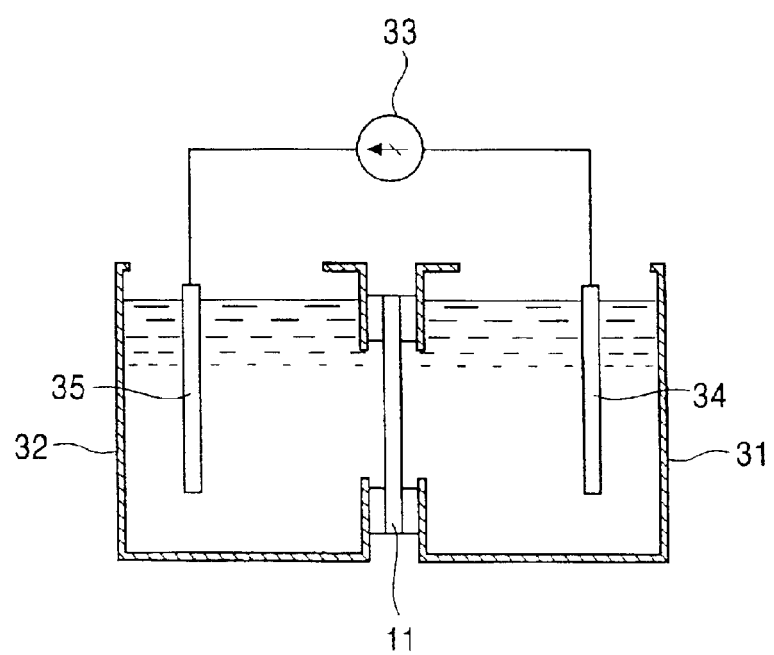
FIG. 11 is a cross-sectional view of an anodic oxidation apparatus used for forming a porous layer in the production steps of the semiconductor substrate shown in FIG. 6.

After the variant impurity layer 21 is formed, the variant impurity layer is subjected to anodic oxidation to form a porous layer 12 in the variant impurity layer, as shown in FIG. 6B (porous layer forming step). For example, as shown in FIG. 11, a supporting substrate 11 provided with a variant impurity layer 21 is placed between two electrolytic vessels 31 and 32, and platinum electrodes 34 and 35 connected to a DC source 33 are placed in the electrolytic vessels 31 and 32, respectively. DC currents are applied between the supporting substrate 11 as an anode and the platinum electrodes 34 and 35 as cathodes to form pores in the variant impurity layer. This method is disclosed by Itoh, et al., in *Surface Technology*, 46(5), 8-13 (1995) "Anodic oxidation of Porous Silicon". The electrolytic solution is, for example, a mixture of hydrogen fluoride and ethyl alcohol.

In the anodic oxidation, factors determining the porosity of the porous layer 12 include the impurity concentration in the porous layer 12, the density of the current applied, and the concentration of the electrolytic solution (for example, the hydrogen fluoride content). For example, the porosity increases with an increased current density and decreases with a decreased impurity concentration. The variant impurity layer 21 is composed of a low-impurity sublayer 21a and a high-impurity sublayer 21b. Thus, by decreasing the current density or the treating time or by increasing the content of hydrogen fluoride, a high-porosity sublayer 12a having high porosity is formed of the low-impurity sublayer 21a, whereas a low-porosity sublayer 12b having low porosity is formed of the high-impurity sublayer 21b. In the anodic oxidation, long pores are formed and orientated in the depth direction of the porous layer 12.

When a supporting substrate 11 composed of a p-type semiconductor is used in the anodic oxidation, a part of the supporting substrate 11, which also functions as a part of the variant impurity layer 21, may also become porous in addition to the variant impurity layer 21. Pores are not always necessary in the entirety of the variant impurity layer 21 in the depth direction, and may be formed in a part of the layer.

Next, the porous layer 12 is heated to, for example, 1,080° C. in, for example, a hydrogen (H$_2$) atmosphere to be recrystallized (heating step). Many fine pores are thereby formed in the low-porosity sublayer 12b, and the low-porosity sublayer 12b maintains a smooth surface. The low-porosity sublayer 12b having a high impurity concentration is readily recrystallized, whereas the strength of the high-porosity sublayer 12a decreases by long pores oriented in the transverse direction of the supporting substrate 11.

Next, as shown in FIG. 6C, a semiconductive thin film 13 composed of, for example, single-crystal silicon is epitaxially deposited on the porous layer 12 by, for example, a CVD process (semiconductive thin film forming step). A semiconductor substrate is thereby formed.

An adhesive substrate 15 is bonded onto the surface of the semiconductive thin film 13 with an adhesive layer 14 provided therebetween. An external force is applied so that the supporting substrate 11 and the semiconductive thin film 13 are peeled from each other by cleavage in the high-porosity sublayer 12a (separation step). A thin-film semiconductive member shown in FIG. 5 is thereby formed.

The semiconductor substrate and the thin-film semiconductive member in this embodiment can also be produced by the following process.

Figure 12A:
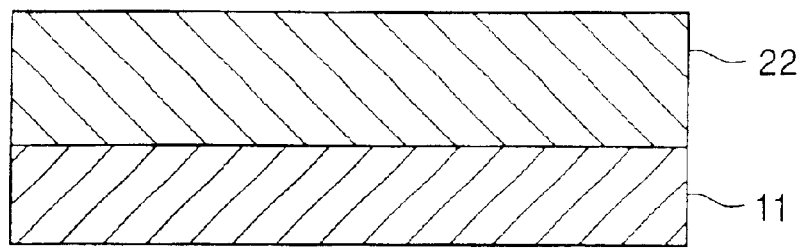
FIGS. 12A to 12C are cross-sectional views for showing steps of another production process of the semiconductor substrate shown in FIG. 1.
Figure 12B:
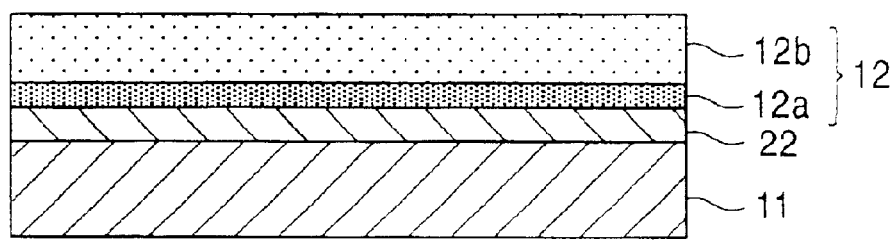
Figure 12C:
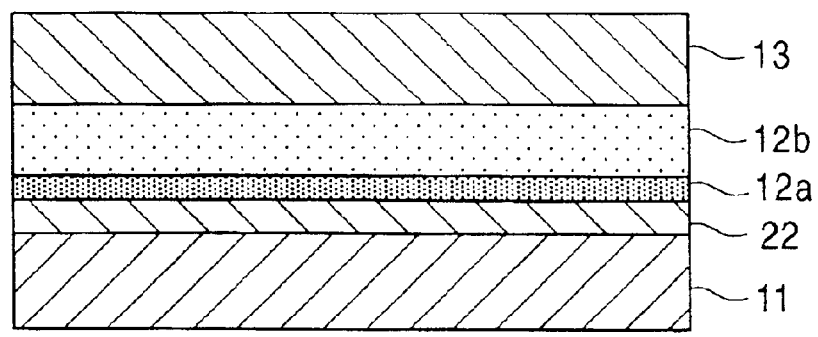

FIGS. 12A to 12C show the production steps. With reference to FIG. 12A, a substrate body 11 is prepared as described above. A high-impurity layer 22 of a semiconductor with an impurity concentration of $1\times10^{18}$ cm$^{-3}$ or more (preferably $1\times10^{19}$ cm$^{-3}$ or more) is formed on one surface of the substrate body 11. The high-impurity layer 22 will be converted into a porous layer 12 later. A variant impurity layer may be formed as a grown layer by epitaxial growth in a CVD process or as a diffusion layer by diffusion of an impurity. The epitaxial growth is preferable since the impurity concentration can be easily increased.

With reference now to FIG. 12B, pores are formed in the high-impurity layer 22 by anodic oxidation as described above in order to form a porous layer 12 composed of, for example, a high-porosity sublayer 12a and a low-porosity sublayer 12b (porous layer forming step). Since the high-impurity layer 22 has a high impurity concentration of $1 \times 10^{18}$ cm$^{-3}$ or more, pores can be readily formed due to low electrical resistance. Thus, both the high-porosity sublayer 12a and the low-porosity sublayer 12b are formed by a small difference in the current density. Furthermore, pores can be formed for a shorter time even in an electrolytic solution having a high hydrogen fluoride content. Pores are not always necessary in the entirety of the high-impurity layer 22 in the depth direction, and may be formed in a part of the layer, as shown in FIG. 12B.

The porous layer 12 is heated in, for example, a hydrogen atmosphere to be recrystallized (heating step). Many fine pores are thereby formed in the low-porosity sublayer 12b, and the low-porosity sublayer 12b has a smooth surface. The low-porosity sublayer 12b having a high impurity concentration is readily recrystallized, whereas the strength of the high-porosity sublayer 12a decreases by long pores oriented in the transverse direction of the supporting substrate 11.

Next, as shown in FIG. 12C, a semiconductive thin film 13 is formed on the porous layer 12 as described above (semiconductive thin film forming step). A semiconductor substrate is thereby formed. An adhesive substrate 15 is bonded onto the surface of the semiconductive thin film 13 with an adhesive layer 14 provided therebetween. The supporting substrate 11 is separated from the semiconductive thin film 13 by cleavage in the high-porosity sublayer 12a (separation step). A thin-film semiconductive member shown in FIG. 5 is thereby formed.

In accordance with the semiconductor substrate of this embodiment, the impurity concentration in the high-porosity sublayer 12a is decreased; hence a high porosity can be achieved for a small current density in the formation of pores by anodic oxidation. Thus, this embodiment does not cause distortion in the porous layer 12 that is inherent in a large current density, and improves crystallinity of the semiconductive thin film 13. A small current density also can improve uniformity of current density, and thus porosity in the transverse direction of the high-porosity sublayer 12a. As a result, the semiconductive thin film 13 is readily separated from the supporting substrate 11 by cleavage in the high-porosity sublayer 12a. The porous layer 12 has an impurity concentration of $1 \times 10^{18}$ cm$^{-3}$ or more, hence the high-porosity sublayer 12a and the low-porosity sublayer 12b can be formed by anodic oxidation of the porous layer 12 when the current density and the change of current density are small.

Since the impurity concentration in the low-porosity sublayer 12b or porous layer 12 is increased, the layer can be readily recrystallized by heating after the pore formation, and the surface can be readily smoothed. The semiconductive thin film 13 has high crystallinity.

The porous layer 12 provided by pore formation in an epitaxial growth layer has a high impurity concentration and a uniform distribution of the impurity in the transverse direction of the layer. Thus, the porous layer 12 has a uniform porosity.

When a semiconductive thin film 13 having uneven surfaces is used as a thin-film semiconductive member in a solar battery, the solar battery has an improved generating efficiency.

Since the thin-film semiconductive member in accordance with the present invention is produced by the semiconductive thin film 13 from the supporting substrate 11 of the semiconductor substrate of the present invention by cleavage in the porous layer 12, the thin-film semiconductive member also has high crystallinity. When a thin-film semiconductive member having uneven surfaces is used in a solar battery, the solar battery has an improved generating efficiency.

According to the method for making a semiconductor substrate of this embodiment, a low-impurity sublayer 21a having a low impurity concentration is formed; hence a high-porosity sublayer 12a having high porosity can be formed by anodic oxidation of a low current density. Such a reduced current density in the anodic oxidation causes improved crystallinity of the semiconductive thin film 13 and uniform porosity in the transverse direction of the porous layer 12. The reduced current density is supplied from a DC current source of low capacity; hence it contributes to decreased production cost.

Since a low-impurity sublayer 21a having a low impurity concentration is formed, a high-porosity sublayer 12a having high porosity is formed for a reduced time in the anodic oxidation, resulting in high production efficiency. The high-porosity sublayer 12a having high porosity can be formed by anodic oxidation in an electrolytic solution having a high hydrogen fluoride content. The use of a large amount of relatively inexpensive hydrogen fluoride contributes to reduced production cost.

The low-impurity sublayer 21a formed by epitaxial growth has a uniform impurity concentration and thus uniform porosity in the transverse direction.

In addition, since a high-impurity sublayer 21b having a high impurity concentration is formed, a low-porosity sublayer 12b having low porosity is formed by anodic oxidation, and recrystallized by heating. Thus the crystallinity of the semiconductive thin film 13 is improved and the surface is smoothed.

According to another embodiment of the method for making a semiconductor substrate, a high-impurity layer 22 with an impurity concentration of $1 \times 10^{18}$ cm$^{-3}$ or more; a high-porosity sublayer 12a and a low-impurity sublayer 21a are formed with a reduced current density in the anodic oxidation. The low-porosity sublayer 12b can be readily recrystallized by heating.

The high-impurity layer 22 formed by epitaxial growth has a high impurity concentration and thus the semiconductor substrate in accordance with the present invention can be readily produced.

In the method for making a semiconductor substrate, when a semiconductive thin film 13 is formed on a porous layer 12 provided on a supporting substrate 11 having an uneven surface, the resulting semiconductive thin film 13 also has uneven surfaces. Thus, a solar battery using the semiconductive thin film 13 has improved generation efficiency.

EXAMPLES

The present invention will now be described in more detail with reference to the following Examples. In the Examples, parts having the same functions as in the above-mentioned embodiments are referred to with the same identification numbers.

Example 1

Figure 13A:
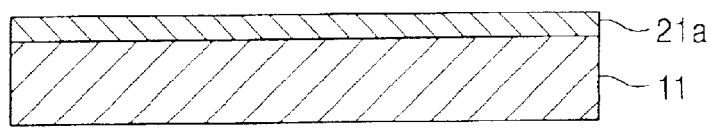
FIGS. 13A to 13F are cross-sectional views for illustrating Example 1 in accordance with the present invention.

FIGS. 13A to 13F are cross-sectional views for describing Example 1. With reference to FIG. 13A, a low-impurity sublayer 21a of a single-crystal silicon with a boron content of $8 \times 10^{14}$ cm$^{-3}$ and a thickness of approximately 1.3 $\mu$m was epitaxially deposited by a CVD process using a silane (SiH$_4$)

material gas on a (100) plane of a supporting substrate 11 of a p-type silicon single crystal having a high boron content formed by a Chochralski method (resistivity: 0.01 to 0.02 Ωcm).

Figure 13B:
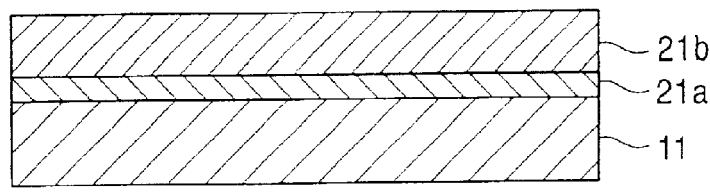

With reference now to FIG. 13B, a high-impurity sublayer 21b of a single-crystal silicon having a boron content of $3 \times 10^{19}$ cm$^{-3}$ and a thickness of approximately 3.8 μm was epitaxially deposited on the low-impurity sublayer 21a by a CVD process using a silane gas (variant layer forming step).

Figure 13C:
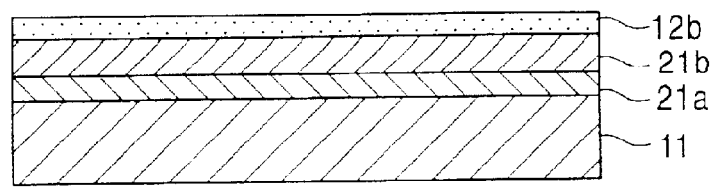
Figure 13D:
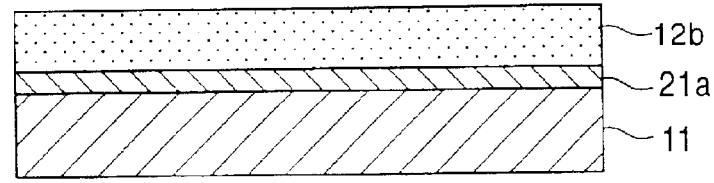
Figure 13E:
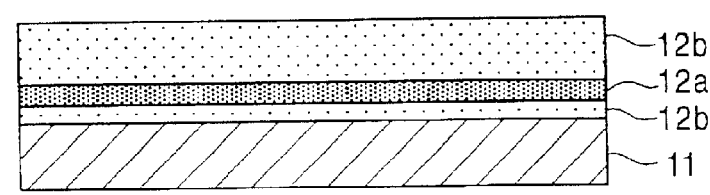

A high-porosity sublayer 12a and a low-porosity sublayer 12b were formed by anodic oxidation while varying the current density, as shown in FIGS. 13C to 13E (porous layer forming step).

The anodic oxidation was performed as described above. A 1:1 mixture of a 50% hydrogen fluoride solution and ethyl alcohol by volume ratio was used as an electrolytic solution. A DC current with a current density of 1 mAcm$^{-2}$ was applied for 8 minutes for converting the surface portion of the high-impurity sublayer 21b into the low-porosity sublayer 12b, as shown in FIG. 13C, and then a DC current with a current density of 7 mAcm$^{-2}$ was applied for 8 minutes for converting also the inner portion of the high-impurity sublayer 21b into the low-porosity sublayer 12b, as shown in FIG. 13D. Further, a DC current with a current density of 30 mAcm$^{-2}$ was applied for 1 minute for converting the low-impurity sublayer 21a into the high-porosity sublayer 12a and simultaneously a surface portion, facing the low-impurity sublayer 21a, of the supporting substrate 11 into the low-porosity sublayer 12b, as shown in FIG. 13E.

The resulting porous layer 12 was heated to 1,080° C. in a hydrogen atmosphere using a normal-pressure epitaxial growth system (heating step). The porous layer 12 was heated from room temperature to 1,080° C. by spending approximately 20 minutes, and was maintained at 1,080° C. for approximately 40 minutes. The porous layer 12 was recrystallized and the surface of the low-porosity sublayer 12b was smoothed. Thus, the strength of the high-porosity sublayer 12a was further decreased.

Figure 13F:
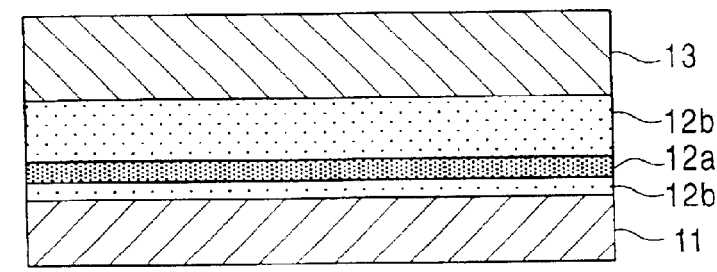

With reference to FIG. 13F, the porous layer 12 was cooled to 1,020° C., and then a semiconductive thin film 13 of single-crystal silicon having a thickness of approximately 5 μm was formed on the porous layer 12 by CVD epitaxial growth for 20 minutes (semiconductor thin film forming step). A semiconductor substrate was thereby formed.

Figure 14:
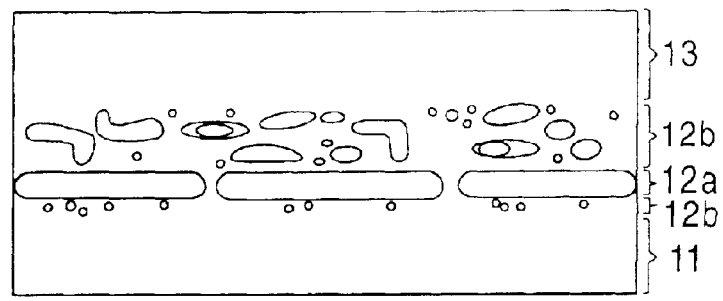
FIG. 14 is a schematic cross-sectional view of the porous layer of the semiconductor substrate shown in FIG. 12.

The cross-section of the resulting semiconductor substrate was cleaved and observed using a scanning electron microscope (SEM). FIG. 14 is a schematic view of the cross-section. A low-porosity sublayer 12b having low porosity is formed in a region of the high-impurity sublayer 21b in the porous layer 12 and has a mesh structure that was recrystallized during the heating step. A high-porosity sublayer 12a having high porosity is formed in a region of the low-impurity sublayer 21a and includes flat voids oriented in the transverse direction and some pillar crystals extending from the supporting substrate 11 to the low-porosity sublayer 12b. The interfacial region between the supporting substrate 11 and the high-porosity sublayer 12a forms an underlying low-porosity sublayer 12b which is substantially completely crystallized and contains a small number of fine pores.

A PET adhesive substrate 15 was bonded onto the semiconductive thin film 13 with an adhesive layer 14 composed of a light-curable resin. An external force was applied so that the supporting substrate 11 and the adhesive substrate 15 were peeled from each other by cleavage in the high-porosity sublayer 12a (separation step, see FIG. 5). The semiconductive thin film 13 was easily separated from the supporting substrate 11 and a thin-film semiconductive member was satisfactorily formed.

According to this example, a high-porosity sublayer 12a having high porosity was formed by anodic oxidation of the low-impurity sublayer 21a with a low current density, and the resulting high-porosity sublayer 12a can be readily cleaved. Furthermore, a low-porosity sublayer 12b with low porosity was formed of the high-impurity sublayer 21b and its surface was smoothed by thermal recrystallization.

Example 2

Figure 15A:
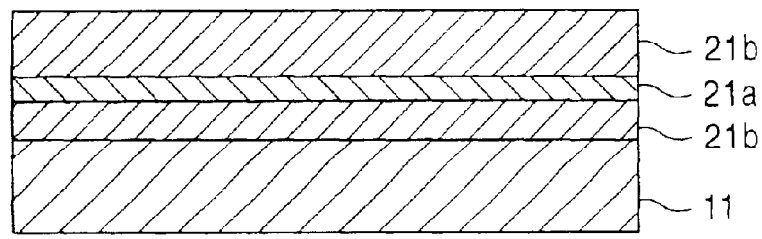
FIGS. 15A to 15C are cross-sectional views for illustrating Example 2 in accordance with the present invention.
Figure 15B:
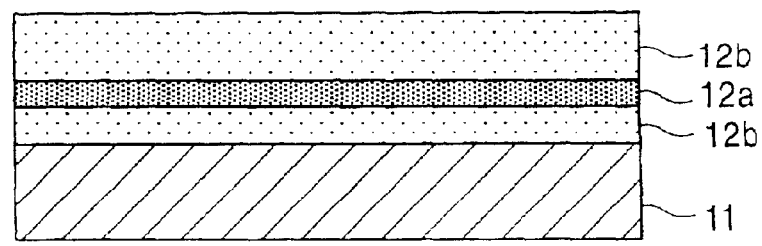
Figure 15C:
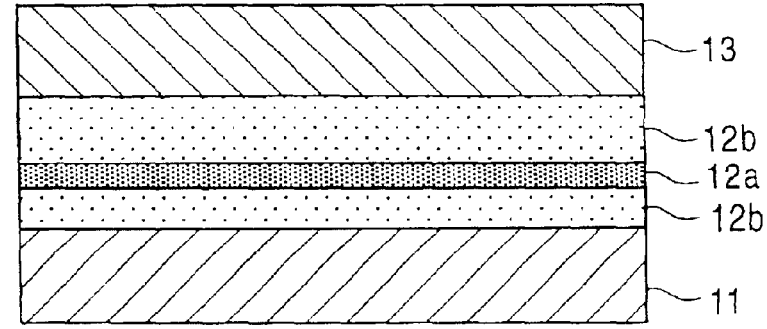

FIGS. 15A to 15C are cross-sectional views for describing Example 2. With reference to FIG. 15A, a high-impurity sublayer 21b of a single-crystal silicon with a boron content of $2.0 \times 10^{19}$ cm$^{-3}$ and a thickness of approximately 10 μm was epitaxially deposited by a CVD process using a silane material gas on a surface of a supporting substrate 11 which was the same as that used in Example 1. A low-impurity sublayer 21a of a single-crystal silicon having a boron content of $8 \times 10^{14}$ cm$^{-3}$ and a thickness of approximately 1.3 μm was epitaxially deposited on the high-impurity sublayer 21b by a CVD process using a silane gas. Furthermore, a high-impurity sublayer 21b of a single-crystal silicon having a boron content of $3 \times 10^{19}$ cm$^{-3}$ and a thickness of approximately 3.7 μm was epitaxially deposited on the low-impurity sublayer 21a by a CVD process using a silane gas (variant layer forming step).

With reference to FIGS. 15B, these layers were subjected to anodic oxidation to form high-porosity sublayers 12a and a low-porosity sublayer 12b (porous layer forming step). The anodic oxidation was performed as described above. A 2:1 mixture of a 50% hydrogen fluoride solution and ethyl alcohol by volume ratio was used as an electrolytic solution. A DC current with a current density of 10 mAcm$^{-2}$ was applied for 5 minutes. The high-impurity sublayer 21b was converted into the low-porosity sublayer 12b having low porosity, whereas the low-impurity sublayer 21a was converted into the high-porosity sublayer 12a having high porosity.

The resulting porous layer 12 was heated as in Example 1 (heating step). A semiconductive thin film 13 of single-crystal silicon having a thickness of approximately 5 μm was formed on the porous layer 12 by epitaxial growth as in Example 1 (semiconductor thin film forming step). A semiconductor substrate was thereby formed.

Figure 16:
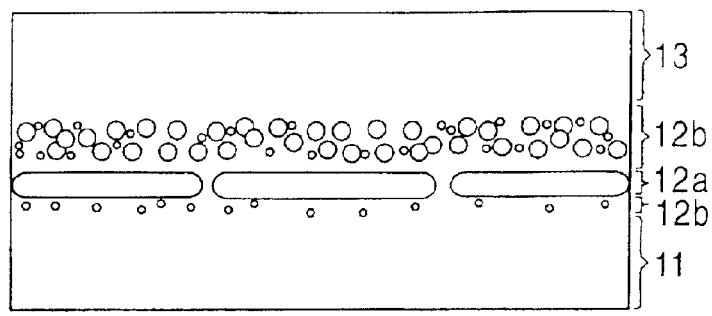
FIG. 16 is a schematic cross-sectional view of the porous layer of the semiconductor substrate shown in FIG. 12.

The cross-section of the resulting semiconductor substrate was cleaved and observed using a SEM. FIG. 16 is a schematic view of the cross-section. An upper low-porosity sublayer 12b having low porosity is formed in a region, at the side of the semiconductive thin film 13, of the high-impurity sublayer 21b in the porous layer 12. The upper low-porosity sublayer 12b has a mesh structure that was recrystallized during the heating step and is composed of many fine spherical pores. A high-porosity sublayer 12a having high porosity is formed in a region of the low-impurity sublayer 21a and includes flat voids oriented in the transverse direction and some pillar crystals extending from the supporting substrate 11 to the low-porosity sublayer 12b. The interfacial region between the supporting substrate 11 and the high-porosity sublayer 12a forms an underlying low-porosity sublayer 12b which is substantially completely crystallized and contains a small number of fine pores.

The semiconductive thin film 13 was separated from the supporting substrate 11 as in Example 1 (separation step). The semiconductive thin film 13 was easily separated from the supporting substrate 11 and a thin-film semiconductive member was satisfactorily formed.

According to this example, a high-porosity sublayer 12a having high porosity was formed by anodic oxidation of the low-impurity sublayer 21a with a low current density and a short treating time in an electrolytic solution having a high hydrogen fluoride content, and the resulting high-porosity sublayer 12a can be readily cleaved. Furthermore, a low-porosity sublayer 12b with low porosity was formed of the high-impurity sublayer 21b and its surface was smoothed by thermal recrystallization, as in Example 1.

Example 3

Figure 17A:
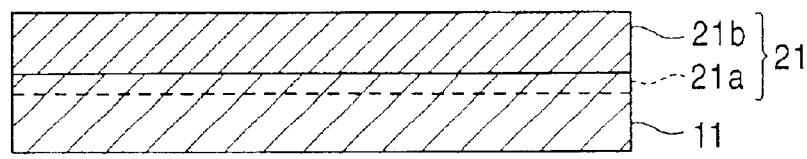
FIGS. 17A to 17C are cross-sectional views for illustrating Example 3 in accordance with the present invention.
Figure 17B:
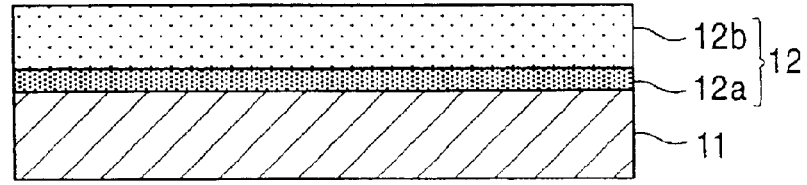
Figure 17C:
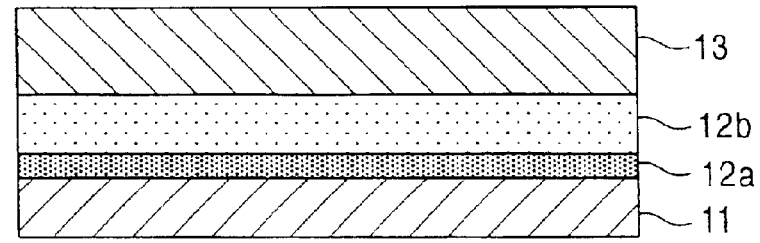

FIGS. 17A to 17C are cross-sectional views for describing Example 3. With reference to FIG. 17A, a high-impurity sublayer 21b of a single-crystal silicon with a boron content of $3.0 \times 10^{19}$ cm$^{-3}$ and a thickness of approximately 3.7 μm was epitaxially deposited by a CVD process using a silane material gas on a surface of a supporting substrate 11 which was the same as that used in Example 1 (variant layer forming step). In Example 3, a part, facing the high-impurity sublayer 21b, of the supporting substrate 11 was regarded as a low-impurity sublayer 21a, hence this part of the supporting substrate 11 and the high-impurity sublayer 21b form a variant impurity layer.

With reference to FIG. 17B, these layers were subjected to anodic oxidation to form a high-porosity sublayer 12a and a low-porosity sublayer 12b (porous layer forming step). The anodic oxidation was performed as in Example 2. The high-impurity sublayer 21b was converted into the low-porosity sublayer 12b having low porosity, whereas the low-impurity sublayer 21a (a part of the supporting substrate 11) was converted into the high-porosity sublayer 12a having high porosity.

The resulting porous layer 12 was heated as in Example 1 (heating step). A semiconductive thin film 13 of single-crystal silicon having a thickness of approximately 5 μm was formed on the porous layer 12 by epitaxial growth as in Example 1 (semiconductor thin film forming step). A semiconductor substrate was thereby formed.

Figure 18:
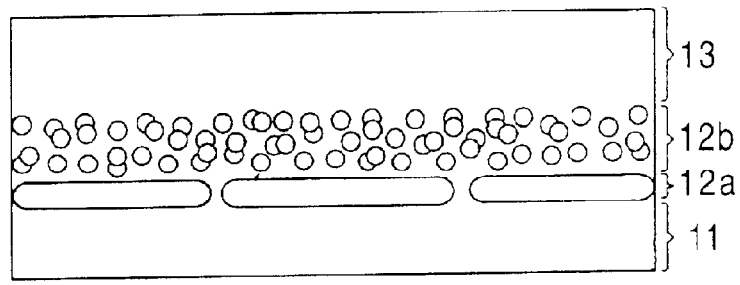
FIG. 18 is a schematic cross-sectional view of the porous layer of the semiconductor substrate shown in FIG. 17.

The cross-section of the resulting semiconductor substrate was cleaved and observed using a SEM. FIG. 18 is a schematic view of the cross-section. An upper low-porosity sublayer 12b having low porosity is formed in a region of the high-impurity sublayer 21b in the porous layer 12. The upper low-porosity sublayer 12b has a mesh structure that was recrystallized during the heating step and is composed of many fine spherical pores. A high-porosity sublayer 12a having high porosity is formed in a region of the low-impurity sublayer 21a, that is, in the upper portion, facing the high-impurity sublayer 21b, of the supporting substrate 11, and includes flat voids oriented in the transverse direction and some pillar crystals extending from the supporting substrate 11 to the low-porosity sublayer 12b.

The semiconductive thin film 13 was separated from the supporting substrate 11 as in Example 1 (separation step). The semiconductive thin film 13 was easily separated by cleavage in the high-porosity sublayer 12a and a thin-film semiconductive member was satisfactorily formed.

Accordingly, this example also has substantially the same advantages as those in Examples 1 and 2.

Example 4

Example 4 will be described with reference to FIGS. 12A to 12C. As shown in FIG. 12A, a high-impurity layer 22 of a single-crystal silicon containing boron and with a thickness of approximately 14 μm was epitaxially deposited by a CVD process using a silane material gas on a surface of a supporting substrate 11 which was the same as that used in Example 1 (variant layer forming step). Five substrates provided with high-impurity layers 22 were prepared so that the boron contents were $1.0 \times 10^{19}$ cm$^{-3}$, $1.3 \times 10^{19}$ cm$^{-3}$, $1.5 \times 10^{19}$ cm$^{-3}$, $1.7 \times 10^{19}$ cm$^{-3}$, and $2.0 \times 10^{19}$ cm$^{-3}$, respectively.

As shown in FIG. 12B, each supporting substrate 11 was subjected to anodic oxidation with varied current densities to form a high-porosity sublayer 12a and a low-porosity sublayer 12b (porous layer forming step). The anodic oxidation was performed as described above. A 1:1 mixture of a 50% hydrogen fluoride solution and ethyl alcohol by volume ratio was used as an electrolytic solution. A DC current with a current density of 1 mAcm$^{-2}$ was applied for 8 minutes for converting the surface portion of the high-impurity layer 22 into the low-porosity sublayer 12b, and then a DC current with a current density of 7 mAcm$^{-2}$ was applied for 8 minutes for converting also the lower portion of the high-impurity layer 22 into an underlying low-porosity sublayer 12b. Further, a DC current with a current density of 120 mAcm$^{-2}$ was applied for 4 seconds for converting the inner portion of the high-impurity layer 22 into the high-porosity sublayer 12a.

Each supporting substrate 11 provided with a porous layer 12 was heated as in Example 1 (heating step). A semiconductive thin film 13 of single-crystal silicon having a thickness of approximately 5 μm was formed on the porous layer 12 by epitaxial growth as in Example 1 (semiconductor thin film forming step), as shown in FIG. 12C. A semiconductor substrate was thereby formed.

Figure 19:
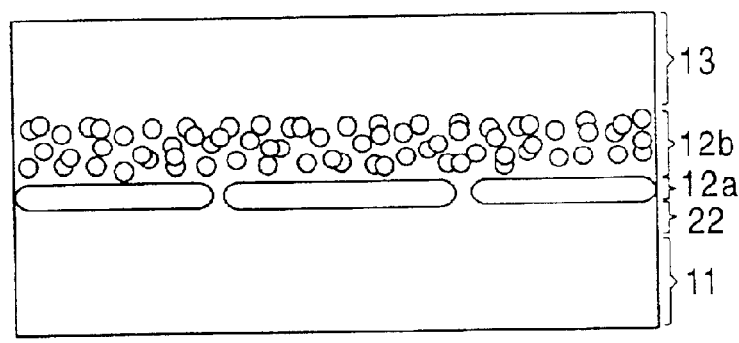
FIG. 19 is a schematic cross-sectional view of a porous layer in Example 4 in accordance with the present invention.
Figure 20:
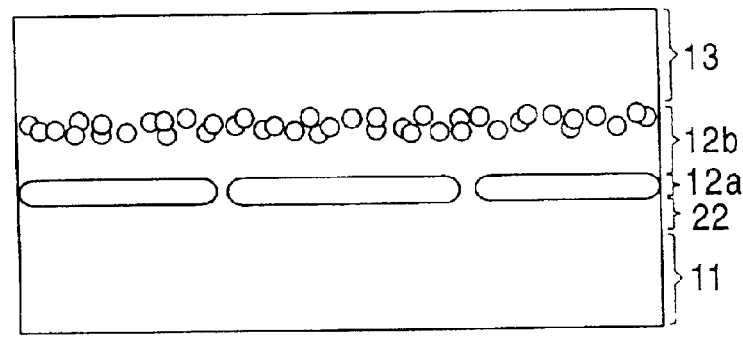
FIG. 20 is a schematic cross-sectional view of another porous layer in Example 4 in accordance with the present invention.
Figure 21:
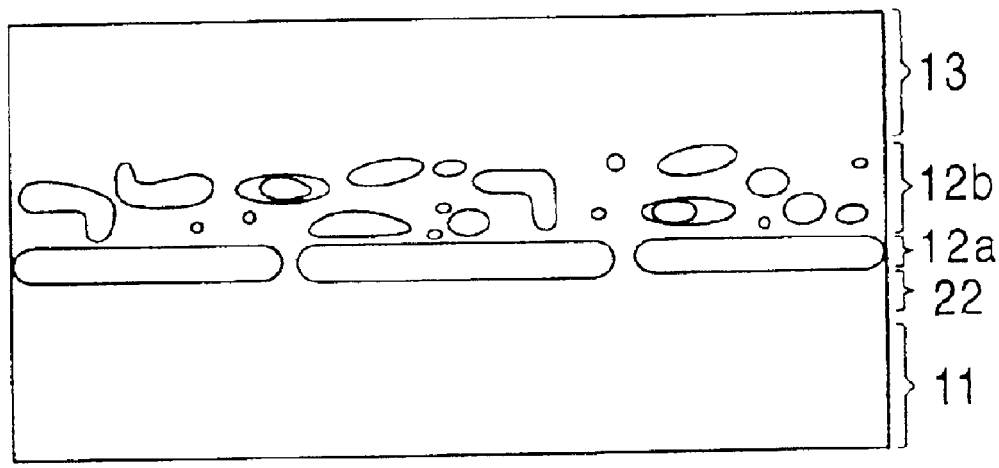
FIG. 21 is a schematic cross-sectional view of another porous layer in Example 4 in accordance with the present invention.

The cross-section of each resulting semiconductor substrate was cleaved and observed using a SEM. FIGS. 19 to 21 are schematic cross-sectional views of semiconductor substrates when the impurity concentrations in the high-impurity layer 22 are $1.0 \times 10^{19}$ cm$^{-3}$, $1.5 \times 10^{19}$ cm$^{-3}$, and $2.0 \times 10^{19}$ cm$^{-3}$, respectively.

As shown in FIGS. 19 to 21, each semiconductor substrate has a high-porosity sublayer 12a formed in the inner portion of the high-impurity layer 22 and a low-porosity sublayer 12b formed in the upper portion, facing the semiconductive thin film 13, of the high-impurity layer 22. The high-porosity sublayer 12a includes flat voids oriented in the transverse direction, whereas the low-porosity sublayer 12b has a mesh structure that was recrystallized during the heating step. The mesh structure differs depending on the impurity concentration. As shown in FIG. 19, many fine spherical pores are formed in the entirety of the low-porosity sublayer 12b for the impurity concentration in the high-impurity layer 22 of $1.0 \times 10^{19}$ cm$^{-3}$. In FIG. 20, fine spherical pores are formed only in the upper portion, facing the semiconductive thin film 13, of the low-porosity sublayer 12b for the impurity concentration in the high-impurity layer 22 of $1.5 \times 10^{19}$ cm$^{-3}$, while the lower portion of the low-porosity sublayer 12b has no pores and is recrystallized. In FIG. 21, elliptic or oblong pores are formed in the entirety of the low-porosity sublayer 12b for the impurity concentration in the high-impurity layer 22 of $2.0 \times 10^{19}$ cm$^{-3}$.

Although not shown in the drawing, the structure of the porous layer 12 for the impurity concentration in the high-impurity layer 22 of $1.3 \times 10^{19}$ cm$^{-3}$ is somewhere between that of FIG. 19 (for $1.0 \times 10^{19}$ cm$^{-3}$) and that of FIG. 20 (for $1.5 \times 10^{19}$ cm$^{-3}$), and the structure for the impurity concentration of $1.7 \times 10^{19}$ cm$^{-3}$ is somewhere that of between FIG. 20 (for $1.5 \times 10^{19}$ cm$^{-3}$) and that of FIG. 21 (for $2.0 \times 10^{19}$ cm$^{-3}$).

Each semiconductive thin film 13 was separated from the supporting substrate 11 as in Example 1 (separation step). The semiconductive thin film 13 was easily separated from the supporting substrate 11 and a thin-film semiconductive member was satisfactorily formed.

The formation of the high-impurity layer 22 facilitates the formation of a high-porosity sublayer 12a and a low-porosity sublayer 12b even when a current density or a change in the current density is reduced. Thus, the high-porosity sublayer 12a can be easily cleaved. The surface of the porous layer 12 is smoothed by recrystallization during the heating treatment.

The present invention is not limited to the above-described embodiments and Examples. For example, although anodic oxidation of the porous layer 12 was described in the embodiments and Examples, other types of anodic oxidation can also be applied to the present invention. Although the porous layer 12 consists of a plurality of sublayers having different impurity concentrations (high-porosity sublayer 12a and low-porosity sublayer 12b) in the embodiments and Examples 1 to 3, the impurity concentration may continuously vary in the depth direction of the porous layer 12.

What is claimed is:

1. A method of making a semiconductor substrate comprising:
    forming a variant impurity layer with an impurity concentration varying in a depth direction on one surface of a supporting substrate by means other than anodic oxidation, wherein a variant impurity layer including at least two sublayers having different impurity concentrations is formed in said variant layer forming step; and
    forming a porous layer by providing pores in the variant impurity layer by anodic oxidation so that a porosity in the porous layer varies in the depth direction, wherein a porous layer including at least two sublayers having different porosities is formed in said porous layer forming step.

2. A method of making a semiconductor substrate according to claim 1, wherein at least two sublayers having different impurity concentrations are formed on one surface of the supporting substrate in said variant layer forming step.

3. A method of making a semiconductor substrate according to claim 1, wherein, in said variant layer forming step, a growth layer is deposited on one surface of the supporting substrate, and then an impurity is diffused into the growth layer so as to form at least two sublayers having different impurity concentrations.

4. A method of making a semiconductor substrate comprising:
    forming a variant impurity layer with an impurity concentration varying in a depth direction on one surface of a supporting substrate by means other than anodic oxidation, wherein, in said variant layer forming step, a low-impurity sublayer comprising a semiconductor having a low impurity concentration is formed and a high-impurity sublayer comprising a semiconductor having a high impurity concentration is formed on the surface, away from the supporting substrate, of the low-impurity sublayer; and
    forming a porous layer by providing pores in the variant impurity layer by anodic oxidation so that a porosity in the porous layer varies in the depth direction.

5. A method of making a semiconductor substrate according to claim 4, wherein, in said variant layer forming step, each of said supporting substrate and said variant impurity layer comprises p-type silicon containing a p-type impurity, the low-impurity sublayer has a p-type impurity concentration of $1\times10^{19}$ cm$^{-3}$ or more, and the high-impurity sublayer has a p-type impurity concentration of less than $1\times10^{19}$ cm$^{-3}$.

6. A method of making a semiconductor substrate comprising:
    forming a variant impurity layer with an impurity concentration varying in a depth direction on one surface of a supporting substrate by means other than anodic oxidation;
    forming a porous layer by providing pores in the variant impurity layer by anodic oxidation so that a porosity in the porous layer varies in the depth direction; and
    forming a semiconductive thin film on the surface, away from the supporting substrate, of the porous layer.

7. A method of making a semiconductor substrate according to claim 6, wherein said semiconductive thin film is formed of a single crystal provided by epitaxial growth.

8. A method of making a semiconductor substrate according to claim 6, wherein said semiconductive thin film comprises a semiconductor selected from the group consisting of a semiconductor containing at least one of silicon and germanium, a semiconductor containing gallium and arsenic, a semiconductor containing gallium and phosphorus, and a semiconductor containing gallium and nitrogen.

9. A method of making a semiconductor substrate comprising:
    forming a variant impurity layer with an impurity concentration varying in a depth direction on one surface of a supporting substrate by means other than anodic oxidation;
    forming a porous layer by providing pores in the variant impurity layer by anodic oxidation so that a porosity in the porous layer varies in the depth direction; and
    heating the porous layer for recrystallization.

10. A method of making a semiconductor substrate comprising:
    forming a high-impurity layer comprising a semiconductor having an impurity concentration of $1\times10^{18}$ cm$^{-3}$ or more on one surface of a supporting substrate by means other than anodic oxidation, wherein in said high-impurity layer forming step, the high-impurity layer is formed by epitaxial growth; and
    forming pores in the high-impurity layer by anodic oxidation to form a porous layer having different porosities in a depth direction.

11. A method of making a thin-film semiconductive member comprising:
    forming a variant impurity layer with an impurity concentration varying in a depth direction on one surface of a supporting substrate by means other than anodic oxidation;
    forming a porous layer by providing pores in the variant impurity layer by anodic oxidation so that a porosity in the porous layer varies in a depth direction;
    forming a semiconductive thin film on the surface, away from the supporting substrate, of the porous layer; and
    separating the semiconductive thin film from the supporting substrate by cleavage in a porous phase.

12. A method of making a thin-film semiconductive member comprising:
    forming a high-impurity layer comprising a semiconductor having an impurity concentration of $1\times10^{18}$ cm$^{-3}$ or more on one surface of a supporting substrate by means other than anodic oxidation;
    forming pores in the high-impurity layer by anodic oxidation to form a porous layer having different porosities in a depth direction;
    forming a semiconductive thin film on the surface, away from the supporting substrate, of the porous layer; and
    separating the semiconductive thin film from the supporting substrate by cleavage in a porous phase.

* * * * *